(12) United States Patent
Brokaw

(10) Patent No.: US 7,161,432 B2
(45) Date of Patent: Jan. 9, 2007

(54) CURRENT MIRROR WITH LOW HEADROOM REQUIREMENT

(75) Inventor: A. Paul Brokaw, Tucson, AZ (US)

(73) Assignee: Analog Devices, Inc., Norwood, MA (US)

( * ) Notice: Subject to any disclaimer, the term of this patent is extended or adjusted under 35 U.S.C. 154(b) by 149 days.

(21) Appl. No.: 11/108,990

(22) Filed: Apr. 18, 2005

(65) Prior Publication Data

US 2006/0232340 A1    Oct. 19, 2006

(51) Int. Cl.
   *H03F 3/04* (2006.01)
(52) U.S. Cl. ...................................... 330/288
(58) Field of Classification Search .................. None
   See application file for complete search history.

(56) References Cited

U.S. PATENT DOCUMENTS 6,529,076 B1 * 3/2003 Escobar-Bowser .......... 330/252

7,113,042 B1 * 9/2006 Richard et al. ............. 330/277

* cited by examiner

*Primary Examiner*—Robert Pascal
*Assistant Examiner*—Alan Wong
(74) *Attorney, Agent, or Firm*—Koppel, Patrick & Heybl

(57) ABSTRACT

A current mirror circuit includes a current input node for receiving an input current, an upper, cascoded current mirror, a lower current mirror, and a biasing means. In a FET implementation, the upper mirror includes first and second cascoded FETs which are connected together at the current input node, and third and fourth cascoded FETs connected to mirror the current conducted by the first and second FETs. The lower current mirror receives the mirrored current and mirrors it back to the upper mirror, thereby providing positive feedback. The net loop gain is between zero and one. When so arranged, the third and fourth FETs conduct a current which is proportional to an applied input current. The upper mirror transistors are biased such that the voltage at the current input node is substantially closer to the supply voltage than the voltages at the gates of the first and third FETs.

18 Claims, 4 Drawing Sheets

CURRENT MIRROR WITH LOW HEADROOM REQUIREMENT

BACKGROUND OF THE INVENTION

1. Field of the Invention

This invention relates to the field of current mirrors, and particularly to current mirrors having low headroom requirements.

2. Description of the Related Art

Current mirrors are ubiquitous in analog circuit design. A given current mirror circuit requires a minimum amount of "headroom"—i.e., the supply voltage for the mirror and its driving circuitry must be greater than a particular minimum to ensure proper operation.

For example, the output of a bandgap voltage reference is often used to generate bias currents; one circuit for doing this is shown in FIG. 1a. A temperature-compensated reference voltage $V_{ref}$, typically ~1.2 volts, is buffered with an amplifier A1, the output of which drives a ground-referred bipolar transistor 10, with the resulting current mirrored to provide the bias currents 12, 14. If a simple field-effect transistor (FET) mirror 16 is used, the supply voltage (V+) needed for proper operation will have to include the mirror FETs' drain-source voltage ($V_{ds}$), the base-emitter voltage ($V_{be}$) of bipolar transistor 10, and reference voltage $V_{ref}$. Thus, the minimum supply voltage required for this circuit is approximately given by:

$$V+(min)=V_{ref}+V_{be}+V_{ds}=1.2V+0.6V+1V=2.8V.$$

For better performance, a cascoded current mirror 18 may be employed, as shown in FIG. 1b. Here, however, an additional drain-source voltage must be accommodated. Therefore, for this arrangement, V+(min) is approximately given by:

$$V+(min)=V_{ref}+V_{be}+2*V_{ds}=1.2V+0.6V+2V=3.8V.$$

However, analog circuitry is increasingly required to operate with supply voltages that are less than those calculated above. As such, there is a need for a current mirror circuit having a low headroom requirement.

SUMMARY OF THE INVENTION

A current mirror circuit is presented which addresses the problem noted above, providing accurate performance while having a low headroom requirement.

The present current mirror circuit includes a current input node for receiving an input current to be mirrored, an upper, cascoded current mirror, a lower current mirror, and a biasing means. The circuit can be made from bipolar transistors (BJTs), FETs, or some combination thereof; a FET implementation is described here for purposes of illustration.

The upper mirror includes first and second FETs connected between a supply voltage and a first node, with the drain of the first FET and the source of the second FET connected together at the current input node, and third and fourth FETs connected between the supply voltage and a second node, with the drain of the third FET and the source of the fourth FET connected together at a third node. The first and third FETs' gates are connected together and to the first node, and the second and fourth FETs' gates are connected together, such that the four FETs form a cascoded current mirror which mirrors the current conducted by the first and second FETs to the second node.

The lower current mirror is connected to receive the current at the second node and to mirror it back to the first node, thereby providing positive feedback to the upper current mirror, with the upper and lower mirrors arranged such that the net loop gain is less than one. When so arranged, an input current applied to the current input node results in the third and fourth FETs conducting a current which is proportional to the applied input current.

The invention includes a means for biasing the transistors of the upper mirror such that the voltages at the current input node and the third node are substantially closer to the supply voltage than the voltages at the gates of the first and third FETs. This arrangement enables the present current mirror circuit to have a low headroom requirement, and thus be useful in many low supply voltage applications. For example, when employing a current mirror circuit per the present invention, a bias current generating circuit as described above can operate from a supply voltage of less than 2.3 volts.

Further features and advantages of the invention will be apparent to those skilled in the art from the following detailed description, taken together with the accompanying drawings.

DETAILED DESCRIPTION OF THE INVENTION

Figure 1A:
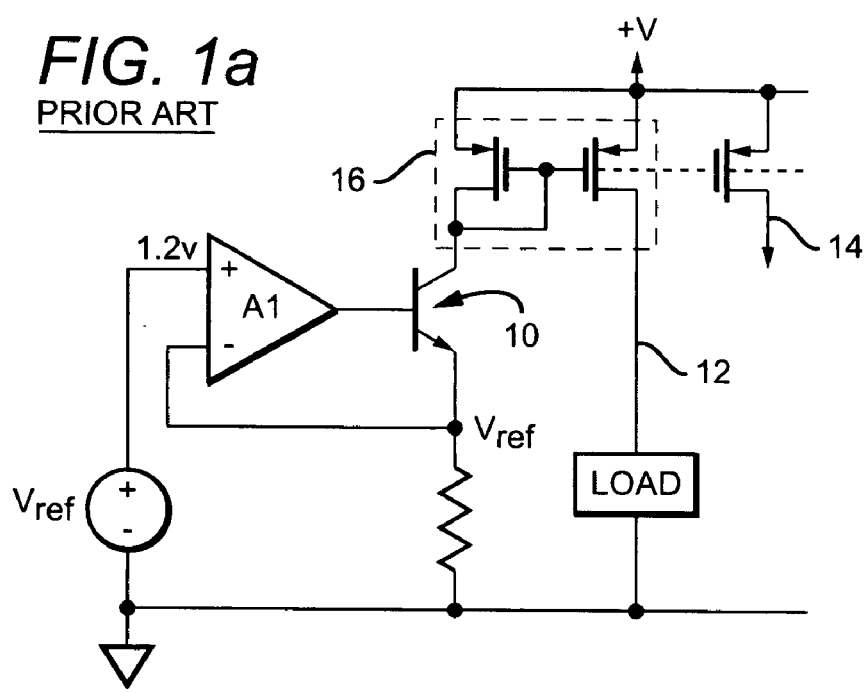
FIGS. 1a and 1b are schematic diagrams of bias current generating circuits which employ known current mirrors.
Figure 1B:
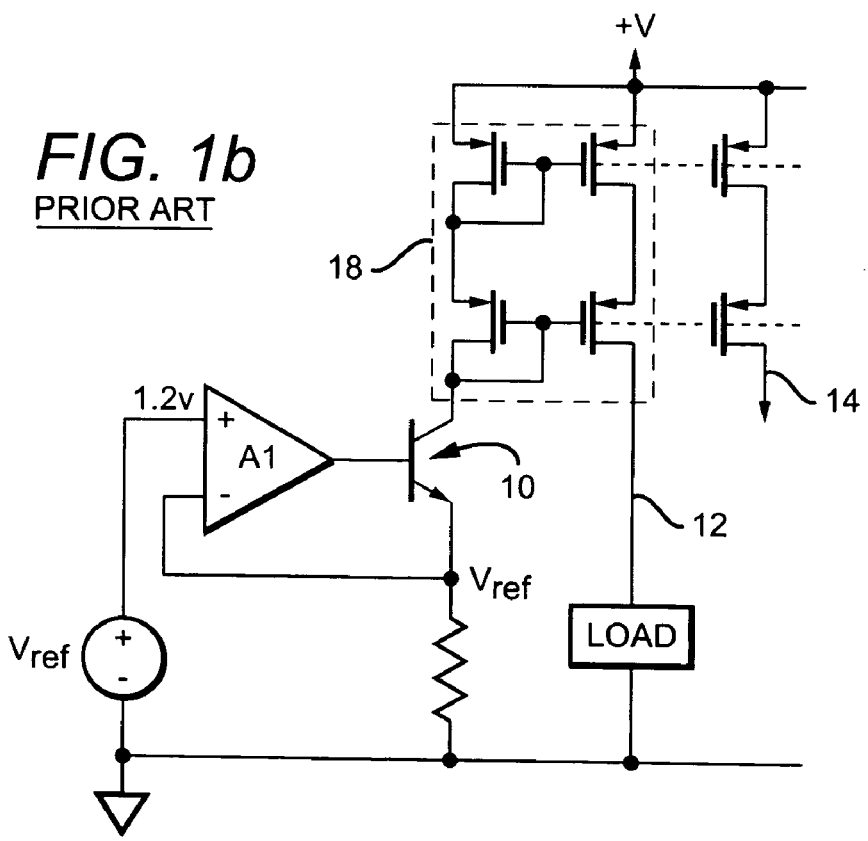
Figure 2:
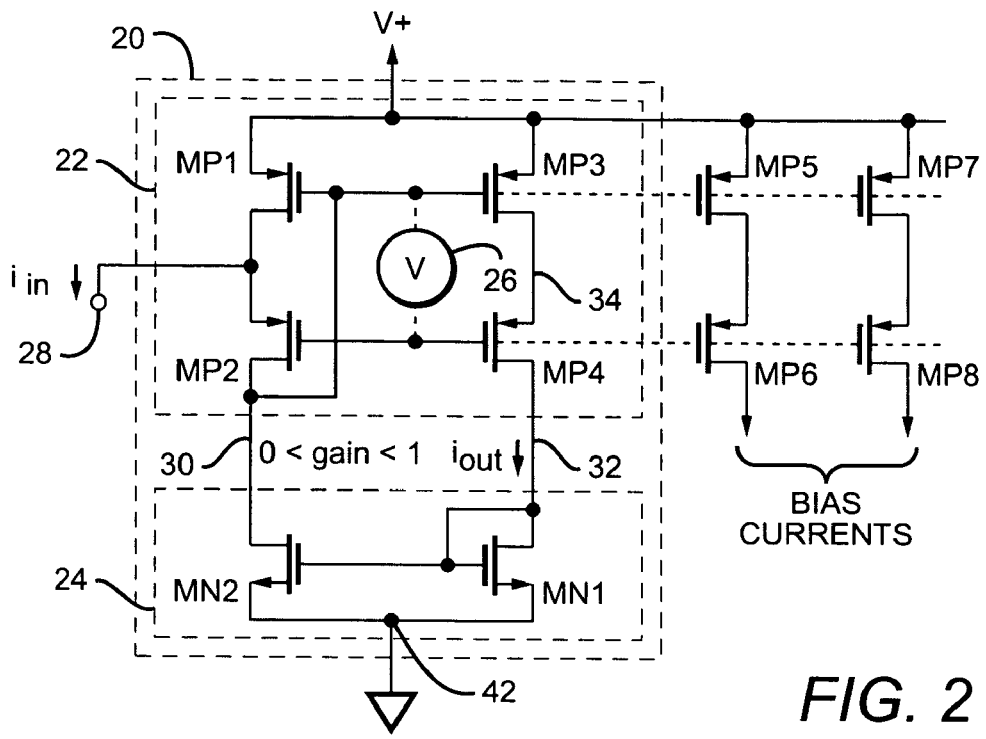
FIG. 2 is a FET embodiment of a current mirror circuit per the present invention.

The present current mirror circuit offers accurate replication of an input current with a low headroom requirement; one possible embodiment is shown in FIG. 2. As noted above, the current mirror circuit can be made from BJTs, FETs, or some combination thereof; a FET implementation is shown in FIG. 2.

The current mirror circuit 20 includes an upper current mirror 22, a lower current mirror 24, and a means 26 for biasing the upper mirror transistors. Circuit 20 includes a current input node 28 for receiving an input current (I) to be mirrored. Upper current mirror 22 comprises first and second FETs (MP1, MP2) connected in a cascode configuration between a supply voltage (V+) and a node 30, with the drain of the MP1 and the source of MP2 connected together at current input node 28. Upper mirror 22 also includes third and fourth FETs (MP3, MP4) connected in a cascode configuration between V+ and a node 32, the drain of MP3 and the source of MP4 connected together at a node 34. The gates of MP1 and MP3 are connected together and to node 30, and the gates of MP2 and MP4 are connected together, such that MP1–MP4 form a cascoded current mirror which mirrors a current conducted by MP1 and MP2 to node 32.

Lower current mirror 40 is connected to receive the current at node 32 and to mirror it back to upper mirror 22 at node 30, thereby providing positive feedback to the upper mirror. In this exemplary embodiment, lower mirror 40 comprises a diode-connected NMOS FET MN1 connected between node 32 and a circuit common point 42, and a second NMOS FET MN2 connected between node 30 and circuit common point 42. The upper and lower mirrors are arranged such that the net loop gain is between zero and one.

When so arranged, a current from MN2 pulls down the gates of MP1 and MP2 until they conduct the MN2 current. If an input current $i_{in}$ is applied to current input node 28, the source of MP2 is driven negative, shifting down the gate voltages of MP1 and MP2 until the gate voltage of MP1 is sufficient to supply both the MN2 and $i_{in}$ current combined. The gates of MP3 and MP4 are driven by these same voltages, such that they conduct a current $i_{out}$ which is proportional to input current $i_{in}$. Output currents proportional to input current $i_{in}$ are then generated for use by other circuits using 'takeoff' transistors connected in parallel with MP3 and MP4; in FIG. 2, MP5 and MP6 generate one such current, and MP7 and MP8 generate another. Additional output currents are generated in the same fashion.

The present mirror circuit also includes means 26 for biasing the FETs of upper mirror 22, such that the voltages at the sources of cascode FETs MP2 and MP4 (and current input node 28) are substantially more positive, or closer to supply voltage V+, than are the voltages at the gates of MP1 and MP3. This enables the mirror circuit shown in FIG. 2 to replicate an input current with ~300 mV or less of compliance voltage from the supply driving the mirror.

For proper operation, the net loop gain must be between zero and one. A gain of ½ is preferred, as it is conveniently arranged and provides a ratio of $i_{in}$ to $i_{out}$ of one, but is not required. The circuit will work with other gain values, but the ratio of $i_{in}$ to $i_{out}$ will be different from one. This may be desired in some cases, and is easily arranged, though error sensitivity will be greatest at gain values near zero and one.

The desired gain is achieved by properly selecting the upper and lower mirror ratios. The loop gain ratio may be arranged by any combination of ratios in MP1:MP3 and in MN1:MN2, although some combinations may be preferred for reasons of sensitivity to errors (like device mismatch) and other practical reasons. For example, a gain of ½ can be achieved by making the ratio of upper mirror FETs MP1 to MP3 2:1 (with MP2 and MP4 being unit size), and making the ratio of lower mirror FETs MN1 to MN2 1:1.

As another example, if MP1 and MP3 were made the same size, but MN2 was half the size of MN1, the $i_{in}$ to $i_{out}$ ratio would still be one. Now, however, since current in MP1 remains twice the input current, MP2, MP3 and MP4 would run at twice the input current. The takeoff transistors could be made half the size of MP1 and MP3 to maintain an $i_{in}$ to $i_{out}$ ratio of one, but the overall operating current would be larger.

Figure 3:
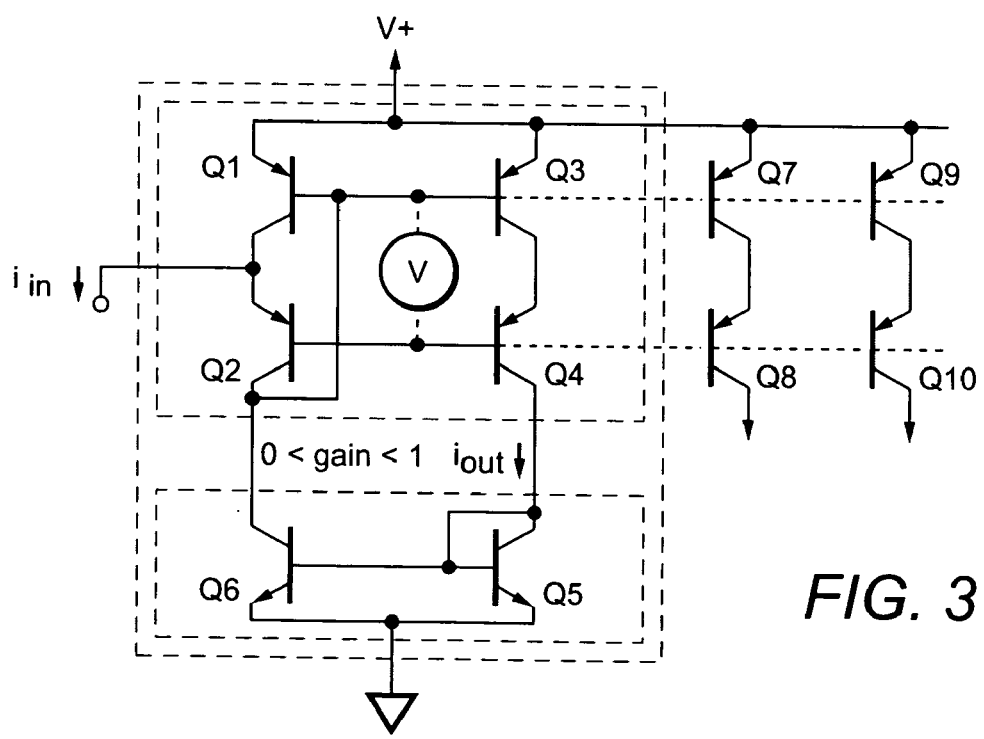
FIG. 3 is a BJT embodiment of a current mirror circuit per the present invention.

As noted above, the present current mirror circuit can be made from BJTs, FETs, or some combination thereof. An exemplary BJT implementation, which would have a low headroom requirement similar to that of the FET implementation shown in FIG. 2, is shown in FIG. 3.

Figure 4:
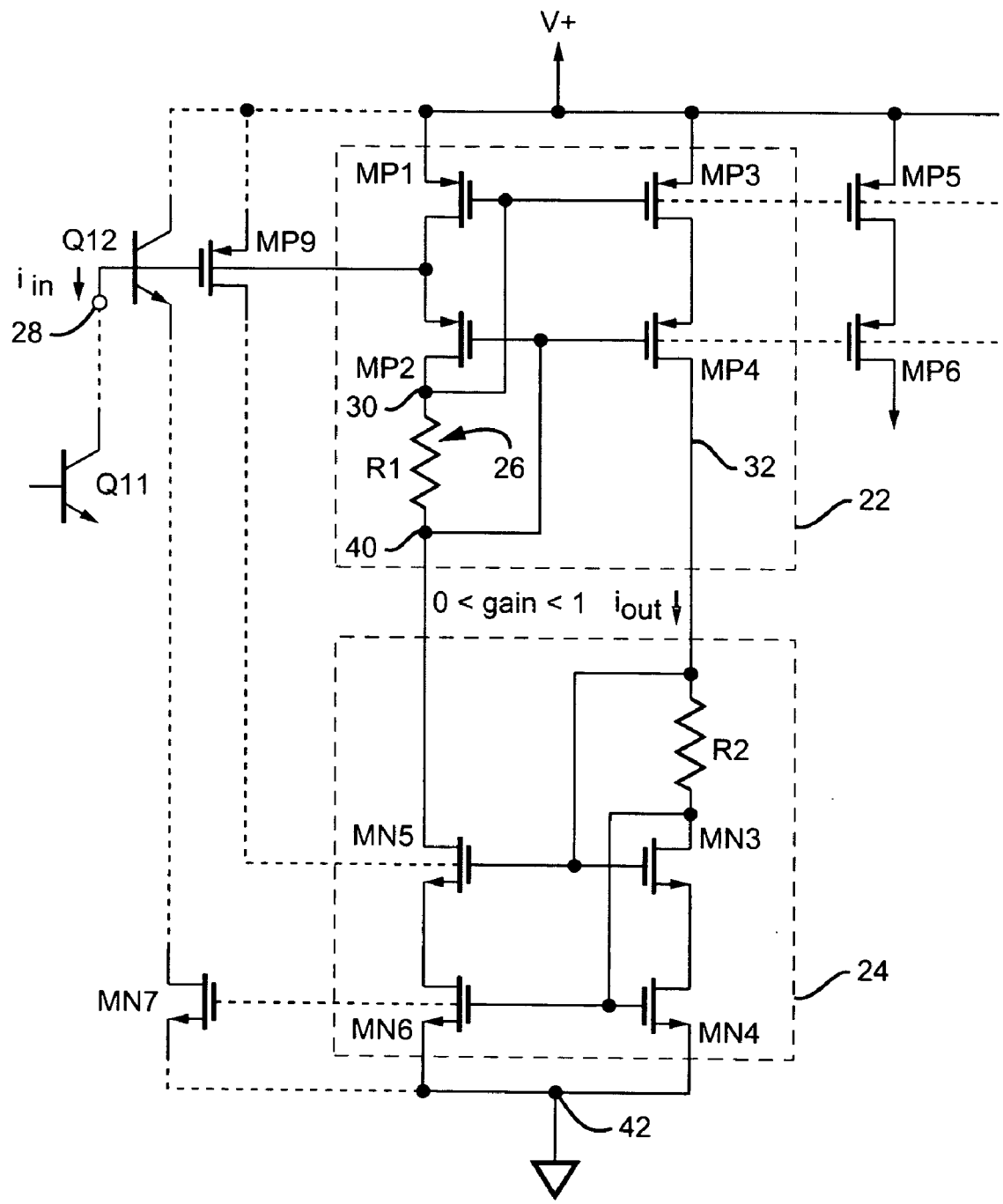
FIG. 4 is a preferred embodiment of a current mirror circuit per the present invention.

A preferred embodiment of the present current mirror is shown in FIG. 4. Here, upper cascoded current mirror 22 is as before, comprising FETs MP1-MP4. For improved performance, lower current mirror 24 is preferably also implemented as a cascoded mirror, made from FETs MN3 and MN4 on the input side, and FETs MN5 and MN6 on the output side.

Biasing means 26 is preferably implemented with a resistance R1 connected between node 30 and the output of the lower current mirror such that R1 conducts the current mirrored to node 30, with the gates of MP2 and MP4 connected to the junction 40 of R1 and MN5. When so arranged, the source-drain voltage of MP1 should stabilize at approximately the voltage across R1. If the mirror circuit is intended to operate at a known current, R1 can be chosen to set the nominal input voltage of the upper mirror. This voltage should be chosen in conjunction with MP1's channel support voltage to give MP1 adequate headroom.

A similar arrangement is preferably employed for cascoded lower mirror 24. A resistance R2 is connected between node 32 and MN3 such that R2 conducts the current ($i_{out}$) mirrored by MP3/MP4 to the lower mirror. R2 can be chosen to stabilize the drain voltage of MN3 at a suitable compromise between the available supply voltage and the desire for a large channel support voltage.

Zero current is one of the stable operating points for the current mirror circuit shown in FIG. 4; as such, some starting means is required. One possible starting method is to temporarily inject a starting current at node 32 when an input current has been applied to current input node 28; the starting current is mirrored to node 30 to start the current mirror circuit. This might be accomplished by, for example, connecting a FET MP9 between supply voltage V+ and node 32, as shown in FIG. 4. Assume that input current $i_{in}$ is applied via a BJT Q11, the collector of which is connected to current input node 28. If the mirror circuit is in the off state, current from Q11 pulls the drain of MP1—and the collector of Q11—low, without resistance. As the collector voltage falls, MP9 is driven on and delivers starting current to MN3, via R2. This current is mirrored by MN5/MN6 to the upper mirror, where it augments the starting current. As MP1 is driven on, regeneratively, it pulls up the collector of Q11 to a voltage largely determined by R1 and the current in Q11.

The present current mirror circuit might also include a BJT which provides a current that compensates for the base current of Q11; one possible implementation is shown in FIG. 4. Here, a BJT Q12 has its base connected to current input node 28, its collector connected to V+, and its emitter connected to a FET MN7 which provides an operating current for Q12 approximately equal to the operating current of Q11, causing Q12 to contribute a base current to the input of the upper mirror to make up for the base current of Q11.

Figure 5:
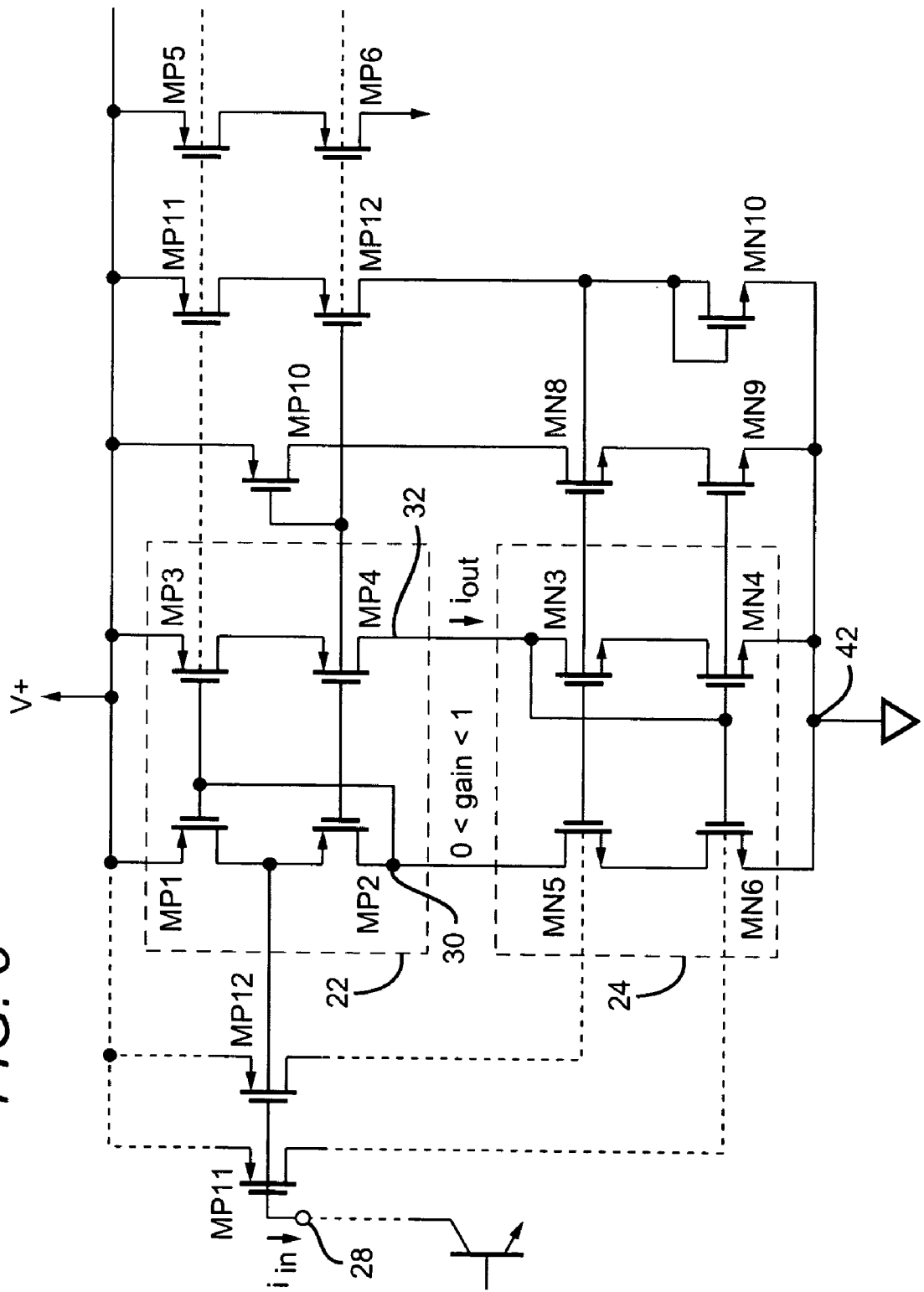
FIG. 5 is another possible embodiment of a current mirror circuit per the present invention.

Another possible means for biasing the upper mirror transistors is illustrated in FIG. 5. Here, the resistors have been removed in favor of two long-channel FET devices which set the cascode voltage. FETs MN8 and MN9 are added to the lower mirror, and the resulting current is used to drive a diode-connected long-channel FET MP10. MP10 should be sized to set the upper cascode line as needed to provide channel support for MP1 and MP2, plus one threshold voltage. A similar arrangement can be used for the cascoded lower mirror. Here, FETs MP11 and MP12 are added to the upper mirror, with the resulting current used to drive a diode-connected long-channel FET MN10, sized to set the cascode voltage for the lower mirror as needed. Note that, when arranged as shown, both MN5 and MN6 need to be driven to insure starting. One way in which this might be accomplished is shown in FIG. 5, in which two FETs MP11 and MP12 are added to provide starting current that drive the gates lines of MN6 and MN5, respectively.

While particular embodiments of the invention have been shown and described, numerous variations and alternate embodiments will occur to those skilled in the art. Accordingly, it is intended that the invention be limited only in terms of the appended claims.

I claim:

1. A current mirror circuit, comprising:
   a current input node for receiving an input current to be mirrored;
   an upper current mirror, comprising:
      first and second transistors (MP1,MP2) having respective current circuits and control inputs, said first and second transistors connected in a cascode configuration between a supply voltage and a first node (30), their current circuits connected together at said current input node; and
      third and fourth transistors (MP3,MP4) having respective current circuits and control inputs, said third and fourth transistors connected in a cascode configuration between said supply voltage and a second node (32) with their current circuits connected together at a third node (34), said first and third transistors' control inputs connected together and to said first node, and said second and fourth transistors' control inputs connected together such that said first, second, third and fourth transistors form a cascoded current mirror which mirrors the current conducted by said first and second transistors to said second node;
   a lower current mirror connected to receive the current at said second node and to mirror said current to said first node to provide positive feedback to said upper current mirror, said upper and lower mirrors arranged such that the net loop gain is between zero and one, such that the current ($i_{out}$) conducted by said third and fourth transistors is proportional to said input current ($i_{in}$) applied to said current input node; and
   a means for biasing said first, second, third and fourth transistors such that the voltages at said current input node and said third node are substantially closer to said supply voltage than the voltages at the control inputs of said first and third transistors.

2. The current mirror circuit of claim 1, wherein said means for biasing said first, second, third and fourth transistors comprises a resistance (R1) connected to said first node at its first terminal and to said lower current mirror at its second terminal such that said resistance conducts the current mirrored to said first node, said second and fourth transistors' control inputs connected to said second terminal.

3. The current mirror circuit of claim 1, wherein said means for biasing said first, second, third and fourth transistors comprises a long-channel field-effect transistor (FET) (MP10) having its source connected to said supply voltage and its gate and drain connected to the control inputs of said second and fourth transistors, said lower current mirror further arranged to mirror said current at said second node to the control inputs of said second and fourth transistors.

4. The current mirror circuit of claim 1, wherein said net loop gain is approximately ½.

5. The current mirror circuit of claim 1, wherein the ratio of input current to output current for said upper current mirror is less than one.

6. The current mirror circuit of claim 1, wherein the ratio of input current to output current for said lower current mirror is less than one.

7. The current mirror circuit of claim 1, wherein said lower current mirror is a cascoded current mirror.

8. The current mirror circuit of claim 7, wherein said lower current mirror comprises:
   fifth and sixth transistors (MN3,MN4) having respective current circuits and control inputs, said fifth and sixth transistors connected in a cascode configuration between a fourth node and a circuit common point;
   seventh and eighth transistors (MN5,MN6) having respective current circuits and control inputs, said seventh and eighth transistors connected in a cascode configuration between said first node and said circuit common point, said fifth and seventh transistors' control inputs connected together and to said second node, and said sixth and eighth transistors' control inputs connected together and to said fourth node; and
   a resistance (R2) connected between said second node and said fourth node.

9. The current mirror circuit of claim 1, further comprising a starting circuit arranged to start said current mirror circuit when an input current has been applied to said current input node.

10. The current mirror circuit of claim 9, wherein said starting circuit comprises a means for temporarily injecting a starting current at said second node when an input current has been applied to said current input node, said starting current mirrored to said first node to start said current mirror circuit.

11. The current mirror circuit of claim 10, wherein said means for temporarily injecting a starting current comprises a transistor (MP9) having a control input connected to said current input node and a current circuit connected between said supply voltage and said second node.

12. A current mirror circuit, comprising:
   a current input node for receiving an input current to be mirrored;
   an upper current mirror, comprising:
      first and second field-effect transistors (FETs) connected in a cascode configuration between a supply voltage and a first node, the drain of said first FET and the source of said second FET connected together at said current input node; and
      third and fourth FETs connected in a cascode configuration between said supply voltage and a second node, the drain of said third FET and the source of said fourth FET connected together at a third node, said first and third FETs' gates connected together and to said first node, and said second and fourth FETs' gates connected together such that said first, second, third and fourth FETs form a cascoded current mirror which mirrors the current conducted by said first and second FETs to said second node;
   a lower current mirror connected to receive the current at said second node and to mirror said current to said first node to provide positive feedback to said upper current mirror, said upper and lower mirrors arranged such that the net loop gain is between zero and one, such that the current ($i_{out}$) conducted by said third and fourth FETs is proportional to said input current ($i_{in}$) applied to said current input node; and
   a means for biasing said first, second, third and fourth FETs such that the voltages at said current input node and said third node are substantially closer to said supply voltage than the voltages at the gates of said first and third FETs.

13. A current mirror circuit, comprising:
   a current input node for receiving an input current to be mirrored;
   an upper current mirror, comprising:
      first and second bipolar transistors (BJTs) connected in a cascode configuration between a supply voltage and a first node, the collector of said first BJT and the emitter of said second BJT connected together at said current input node; and third and fourth BJTs connected in a cascode configuration between said supply voltage and a second node, the collector of said third BJT and the emitter of said fourth BJT connected together at a third node, said first and third BJTs' bases connected together and to said first node, and said second and fourth BJTs' bases connected together such that said first, second, third and fourth BJTs form a cascoded current mirror which mirrors the current conducted by said first and second BJTs to said second node;

a lower current mirror connected to receive the current at said second node and to mirror said current to said first node to provide positive feedback to said upper current mirror, said upper and lower mirrors arranged such that the net loop gain is between zero and one, such that the current ($i_{out}$) conducted by said third and fourth BJTs is proportional to said input current ($i_{in}$) applied to said current input node; and a means for biasing said first, second, third and fourth BJTs such that the voltages at said current input node and said third node are substantially closer to said supply voltage than the voltages at the bases of said first and third BJTs.

14. A current mirror circuit, comprising:

a current input node for receiving an input current to be mirrored;

an upper current mirror, comprising:
first and second field-effect transistors (FETs) connected in a cascode configuration between a supply voltage and a first node, the drain of said first FET and the source of said second FET connected together at said current input node; and third and fourth FETs connected in a cascode configuration between said supply voltage and a second node, the drain of said third FET and the source of said fourth FET connected together at a third node, said first and third FETs' gates connected together and to said first node, and said second and fourth FETs' gates connected together such that said first, second, third and fourth FETs form a cascoded current mirror which mirrors the current conducted by said first and second FETs to said second node;

a resistance connected between said first node and a fourth node (40); and a lower current mirror connected to receive the current at said second node and to mirror said current to said fourth node to provide positive feedback to said upper current mirror;

said upper and lower mirrors arranged such that the net loop gain is between zero and one, such that the current conducted by said third and fourth FETs is proportional to said input current applied to said current input node;

said resistance sized to bias said first, second, third and fourth FETs such that the voltages at said current input node and said third node are substantially closer to said supply voltage than the voltages at the gates of said first and third FETs.

15. The current mirror circuit of claim 14, wherein said net loop gain is approximately ½.

16. The current mirror circuit of claim 14, wherein said lower current mirror is a cascoded current mirror.

17. The current mirror circuit of claim 14, further comprising a starting FET (MP9) having its gate connected to said current input node and its source-drain circuit connected between said supply voltage and said second node such that said starting FET temporarily injects a starting current at said second node when an input current has been applied to said current input node, said starting current mirrored to said fourth node to start said current mirror circuit.

18. The current mirror circuit of claim 14, wherein said input current is conducted by a first bipolar transistor having its collector connected to said current input node and said lower mirror is arranged to generate an additional mirrored current which is approximately equal to said input current, said current mirror circuit further comprising a second bipolar transistor having its base connected to said current input node, its collector connected to said supply voltage, and its emitter connected to said additional mirrored current such that said second bipolar transistor contributes a base current to said current input node which approximately compensates for the base current of said first bipolar transistor.

* * * * *